(12) United States Patent
Brown et al.

(10) Patent No.: US 10,680,194 B2
(45) Date of Patent: Jun. 9, 2020

(54) TRANSPARENT LUMINESCENT DISPLAYS ENABLED BY ELECTRIC-FIELD-INDUCED QUENCHING OF PHOTOLUMINESCENT PIXELS

(71) Applicant: Massachusetts Institute of Technology, Cambridge, MA (US)

(72) Inventors: Patrick R. Brown, Cambridge, MA (US); Geoffrey J. Supran, Cambridge, MA (US); Jeffrey C. Grossman, Brookline, MA (US); Moungi G. Bawendi, Cambridge, MA (US); Vladimir Bulovic, Lexington, MA (US)

(73) Assignee: MASSACHUSETTS INSTITUTE OF TECHNOLOGY, Cambridge, MA (US)

(*) Notice: Subject to any disclaimer, the term of this patent is extended or adjusted under 35 U.S.C. 154(b) by 1111 days.

(21) Appl. No.: 14/993,399

(22) Filed: Jan. 12, 2016

(65) Prior Publication Data

US 2016/0201881 A1    Jul. 14, 2016

Related U.S. Application Data

(60) Provisional application No. 62/102,299, filed on Jan. 12, 2015, provisional application No. 62/182,617, filed on Jun. 21, 2015.

(51) Int. Cl.
*F21V 14/00* (2018.01)
*H01L 51/50* (2006.01)
*H01L 51/52* (2006.01)

(52) U.S. Cl.
CPC ............ *H01L 51/502* (2013.01); *H01L 51/52* (2013.01)

(58) Field of Classification Search
CPC ............................. H01L 51/52; H01L 51/502
See application file for complete search history.

(56) References Cited

U.S. PATENT DOCUMENTS

| | | | | |
|---|---|---|---|---|
| 2003/0230970 | A1* | 12/2003 | Steckl | C09K 11/0883 313/498 |
| 2008/0204383 | A1* | 8/2008 | McCarthy | B82Y 20/00 345/83 |
| 2009/0001385 | A1* | 1/2009 | Skipor | B82Y 20/00 257/79 |
| 2010/0181552 | A1* | 7/2010 | So | H01L 27/288 257/21 |

* cited by examiner

Primary Examiner — Peniel M Gumedzoe
(74) Attorney, Agent, or Firm — Steptoe & Johnson LLP

(57) ABSTRACT

A light emitting device can include a light source, a first electrode, a second electrode, a first barrier layer, a second barrier layer, and an emitter layer between the first barrier layer and the second barrier layer. A method of controllably generating light can comprise two states: An ON state, wherein an emitter layer of a device (which includes a photoluminescent pixel) is illuminated with a light source in the absence of an electric field, and the emitter layer generates light through photoluminescence; and an OFF state, wherein an emitter layer of a device (which includes a photoluminescent pixel) is illuminated with a light source in the presence of a static or time-varying electric field, and the electric field or induced current results in quenching of the emitter photoluminescence.

11 Claims, 5 Drawing Sheets

TRANSPARENT LUMINESCENT DISPLAYS ENABLED BY ELECTRIC-FIELD-INDUCED QUENCHING OF PHOTOLUMINESCENT PIXELS

PRIORITY CLAIM

This application claims priority to U.S. Provisional Application No. 62/102,299, filed Jan. 12, 2015, and U.S. Provisional Application No. 62/182,617, filed Jun. 21, 2015, each of which is incorporated by reference in its entirety.

BACKGROUND

Semiconductor nanocrystals are nanometer-scale fragments of the corresponding bulk crystals, and have properties between those of bulk crystals and molecules. The size-dependent emission is an attractive property of semiconductor nanocrystals. For example, differently sized CdSe nanocrystals can be prepared that emit from blue to red light, with comparatively pure color emissions. These nanocrystal-based emitters can be used for many purposes, such as for solid-state-lighting, solar cells, lasers, and so on.

SUMMARY

In general, a light emitting device can be turned on or off using voltage control. In one aspect, a light emitting device includes a light source, a first electrode, a second electrode, a first barrier layer, a second barrier layer, wherein the first barrier layer and the second barrier layer are between the first electrode and the second electrode, and an emitter layer between the first barrier layer and the second barrier layer, wherein the emitter layer includes a photoluminescent pixel capable of being excited by the light source, wherein at least one barrier layer is transparent, and at least one electrode is transparent.

In certain embodiments, the indexes of refraction of the first electrode, the second electrode, the first barrier layer, the second barrier layer, and the emitter layer at a wavelength of the light source can be within 30% of each other.

In certain embodiments, the emitter layer can include a quantum confined nanostructured material. The emitter layer can include a plurality of photoluminescent pixels. The emitter layer can include photoluminescent pixels of different colors. The emitter layer can include a red photoluminescent pixel, a green photoluminescent pixel, and a blue photoluminescent pixel.

In certain embodiments, the device can include a substrate, wherein the substrate is transparent. Both the first electrode and the second electrode can be transparent. Both the first barrier layer and the second barrier layer can be transparent. In certain embodiments, the first electrode or the second electrode can be opaque. In certain embodiments, the first barrier layer or the second barrier layer can be opaque. The emitter layer can have a thickness of less than 100 nm.

In another aspect, a method of controllably generating light includes generating two states: an ON state, wherein an emitter layer of a device is illuminated with a light source in the absence of an electric field applied between the first and second electrode, and the emitter layer generates light through photoluminescence; and an OFF state, wherein the emitter layer of the device is illuminated with a light source in the presence of a static or time-varying electric field applied between the first and second electrode, and the electric field or an induced current or a charge results in quenching of the emitter photoluminescence, wherein the device includes a photoluminescent pixel.

In certain embodiments, the quenching can be partial. In certain embodiments, the quenching can be complete. The quenching can be more than 90%. The electric field applied can be between $10^3$ and $10^7$ volts per cm. The quenching can be due to stark effect, exciton dissociation, hot charge carrier trapping, rotation of emitter particles, or charge injection. The device can include a plurality of photoluminescent pixels and at least one of the plurality of photoluminescent pixels is selectively turned on and off.

Other aspects, embodiments, and features will be apparent from the following description, the drawings, and the claims.

DETAILED DESCRIPTION

The high luminescence efficiency and uniquely size-tunable color of solution-processable semiconducting colloidal quantum dots (QDs), also called nanocrystals (NCs), highlight their potential use in thin-film display and solid-state lighting applications. Colloidal QDs can be used as luminophores in light emitting devices. See, for example, Shirasaki, Y., et al., Nat. Photonics 7, 13-23 (2013), which is incorporated by reference in its entirety. For visible applications, CdSe-based QDs can be used; their saturated emission spans the visible spectrum, delineating a large potential color gamut that approaches that of the human eye. For example, the color gamut of conventional LCD televisions is enhanced by ~50% by edge-mounted QDs in Sony's 2013 line of Triluminos televisions so as to match 100% of the NTSC television color gamut standard. See, for example, Supran, G. J. et al., MRS Bull. 38, 703-711 (2013), which is incorporated by reference in its entirety.

However, no display technology yet exists that truly harnesses the unrivalled optical performance of QDs. Progress has been made in the performance of electrically driven electroluminescent QD-LEDs, yet these devices continue to be hampered by lifetime and stability issues. See, for example, Kim, T.-H. et al., Nat. Photonics 5, 176-182 (2011), which is incorporated by reference in its entirety. The difficulty of developing energetically matched transparent conductive charge transport layers (CTLs) has also been a limiting factor in the implementation of high-performance transparent displays.

Another issue in QD-LEDs is the quenching of QD photoluminescence quantum yield (PL QY) due to either electric fields or injected charge. See, for example, Bozyigit, D. et al., Adv. Funct. Mater. 23, 3024-3029 (2013), which is incorporated by reference in its entirety. These quenching processes have been viewed as deleterious—they cause, for example, roll-off in the external quantum efficiencies of QD-LEDs at high biases. See, for example, Bozyigit, D. et al., MRS Bull. 38, 731-736 (2013); Shirasaki, Y. et al., Phys. Rev. Lett. 110, 217403 (2013); Bae, W. K. et al., Nat. Commun. 4, 2661 (2013), each of which is incorporated by reference in its entirety.

Electric field-/charge-dependent PL quenching of QDs (or other nanostructured materials—for simplicity referred to as "QDs" hereon) can be used, enabling the reversible electrical modulation of QD PL. QD light emitting technologies based on this concept can harness QDs' optical emissivity in isolation from the challenges of transporting charge through QD films.

Figure 1:
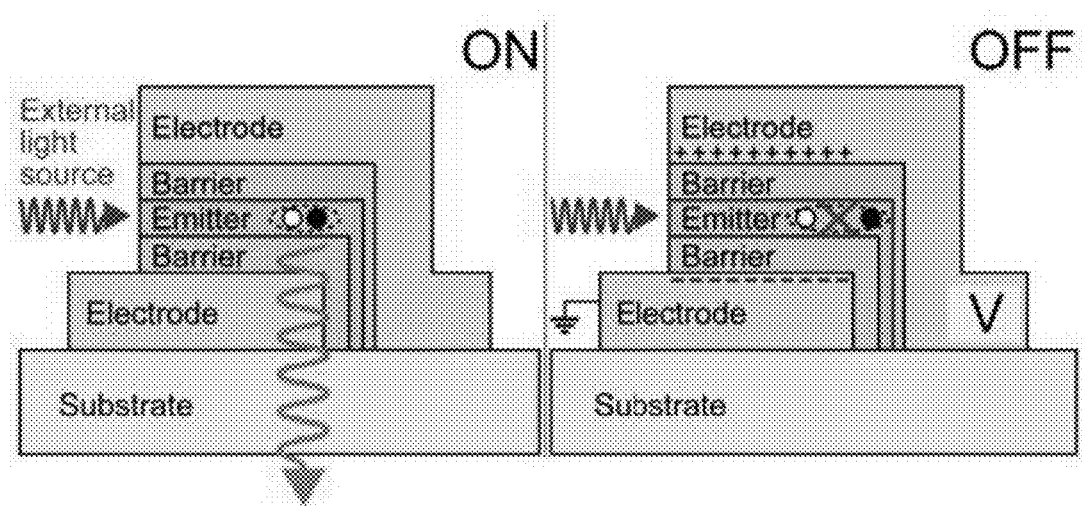
FIG. 1 shows a cross-sectional view of a single photoluminescent pixel (PLP) in both the ON and OFF states, with excitation from the side and emission through the bottom substrate.

A light-emitting device, or photoluminescent pixel (PLP), can be optically illuminated by an external "excitation" light source and re-emits said light as photoluminescence (PL) through the face of the device; the intensity of this PL can be controllably and reversibly diminished (preferably with the ability to completely eliminate the PL) by the application of a static or time-varying electric field across the PLP. As shown in FIG. 1, the PLP can include a thin film of emissive material (the "emitter") sandwiched between two barrier layers, either of which can be a semiconductor or a wide-bandgap dielectric, and at least one of which must be transparent; this barrier/emitter/barrier sandwich is further sandwiched between two electrodes, at least one of which (the one adjacent to the transparent barrier layer) must be transparent. If both barriers and both electrodes are transparent, the PLP constitutes a transparent photoluminescent pixel (TPLP). The reversible diminishment of the PL can take place through a number of methods, including but not limited to the Stark effect, exciton dissociation, exciton quenching through Auger recombination resulting from charge injected into the emitter, exciton quenching resulting from impurities activated by the electric field, or rotation of directionally-emitting emitter particles such that their direction of emission does not coincide with the face of the device.

A light emitting device can include a light source; a first electrode; a second electrode; a first barrier layer; a second barrier layer; wherein the first barrier layer and the second barrier layer are between the first electrode and the second electrode, and an emitter layer between the first barrier layer and the second barrier layer, wherein the emitter layer includes a photoluminescent pixel capable of being excited by the light source; wherein at least one barrier layer is transparent, and at least one electrode is transparent. At least one barrier layer is transparent to the light emitted by the photoluminescent pixel. At least one electrode is transparent to the light emitted by the photoluminescent pixel.

PL emission from an optically excited film can be modulated by addition and removal of an external field or QD charging. This ability to selectively turn on and off individual pixels formed from QDs or other nanostructured emitters can form the basis for a display technology.

A plurality of PLP's can be assembled into a two-dimensional array, with each PLP individually addressable either by crossed electrodes (passive addressing) or by its own thin-film transistor (TFT) (active addressing), but sharing a common external illumination source. The array of PLP's thus constructed constitutes a photoluminescent display (PLD). In one embodiment, the PLD can utilize a transparent substrate and transparent barrier and electrode layers, and a regular array of PLPs in three different colors (red, green, and blue, or RGB), constituting a full-color transparent PLD, though more or fewer colors and/or an opaque display are also possible.

The electrodes for the TPLP can be any of a number of transparent conducting materials, including but not limited to indium tin oxide (ITO), fluorine-doped tin oxide (FTO), indium zinc oxide (IZO), aluminum zinc oxide (AZO), polyethylenedioxythiophene (PEDOT), etc.

The barrier layers can be either charge-transporting semiconductors such as zinc oxide, titanium oxide, molybdenum oxide, tris-(8-hydroxyquinolinato)aluminum, etc, or insulating dielectric materials such as silicon dioxide (silica), hafnium dioxide, aluminum oxide (alumina), poly(methylmethacrylate), parylene, etc; the choice between a charge-transporting semiconductor and an insulating dielectric is predicated upon the mode of operation, as described in detail below.

The emitter can be any of a number of quantum-confined nanostructured materials such as colloidal quantum dots (QDs), nanorods, nanowires, nanoplatelets, etc, made of any of a number of potential compounds (cadmium selenide, cadmium sulfide, cadmium telluride, indium phosphide, lead sulfide, indium arsenide, etc). The aspect ratio of the emitter particles can be varied to change the intensity of the electric-field-induced PL modulation. See, for example, Müller, J. et al., Nano Lett. 5, 2044-9 (2005); Kraus, R. et al., Phys. Rev. Lett. 98, 3-6 (2007), each of which is incorporated by reference in its entirety. The emitter can be a single material or a multi-layer material; for the example of quantum dots, core-only or core-shell variants can be used, depending upon the mode of operation. The surface chemistry of the emitter particles can also be varied in order to control their PL efficiency and the degree of quenching under applied electric field. The physical dimensions of any of these quantum-confined emitters can be varied in order to change the bandgap of the emitter and its corresponding wavelength of emission; for example, the bandgap of an emitter consisting of cadmium selenide QDs can be tuned throughout the visible spectrum by varying the QD size, generating a PLP with an arbitrary color of emission.

The device can be illuminated from the side along the long axis of the substrate. The device can also be illuminated from the front or back face of the substrate or substrates, provided that the substrate on the side of the illumination is transparent to the exciting illumination. This geometry can be useful for applications including, but not limited to, transparent heads-up displays or luminescent transparent window displays.

A number of other sources for the excitation light can be used, including but not limited to: ultraviolet LED, visible LEDs, infrared broad-spectrum LEDs, sunlight, a laser or lasers, an incandescent light, a visible or ultraviolet fluorescent light, etc. Light-diffusers or lenses can be used to optimize the illumination of the PLPs.

A single PLP can be used as a single point or plane source of light, or a plurality of PLPs consisting of emitters and electrodes patterned (through printing, stamping, selective addition or removal, lithography, or any of a number of other techniques) over a large area can be organized into an array with a single or multiple illumination sources, constituting a photoluminescent display (PLD).

In one embodiment, a regular array of PLPs in three different colors (red, green, and blue, or RGB) can be used, constituting a full-color PLD. A single color or two colors of emitters can also be used. Four or more emitters can be used to enhance the accessible area of the chromaticity space. One or more of the emitters can be multi-spectral (such as white), allowing for tuning of the apparent brightness of the individual PLP. The emission color can be outside of the visible spectrum, in the ultraviolet or infrared.

Instead of the transparent device employing transparent substrates, transparent electrodes, and transparent barrier layers described above, opaque materials can also be used for one of the substrates, one of the electrodes, and/or one of the barrier layers. While the transparent device can emit in two directions (from both faces of the substrate), the opaque device only emits in one direction.

Advantages of Displays with Electric Field Induced Quenching

There are numerous advantages to this form of QD light emitting device over LCDs, OLEDs, and other prototype QD-LEDs, including wider viewing angles, transparent light emitting devices, enhanced stability, low voltage operation/low power consumption, increased brightness, and so on.

Traditional electroluminescent display suffers many drawbacks, for example, that electroluminescent quantum yield drops at high brightness; that constant current flow through quantum dots enables electrochemical degradation; the requirement of thick transparent electrodes for current injection, and so on.

LCDs typically exhibit narrow viewing angles. See, for example, Do, Y. R. et al., J. Appl. Phys. 88, 4660 (2000), which is incorporated by reference in its entirety. The use of QD films as direct emitters with isotropic (Lambertian) emission profiles ensures a much wider viewing angle—comparable with OLEDs—than can be achieved via light filtering in LCDs.

Without the need for thick and conductive CTLs, it will be possible to fabricate light emitting devices with greater transparency than that achievable with LCDs (<20%).

Enhanced device stability: In comparison with previous QD-LEDs, which benefit from direct QD light emission, the electric field modulated device in particular relies on optical rather than electrical excitation of QDs. This promises long device lifetimes. Whereas QD stability under electroluminescence (high current density) conditions is an ongoing challenge, QDs' exceptional stability under photoluminescence conditions has already permitted their commercialization. Demonstrations of intrinsic QD PL lifetimes of >14,000 hours and PL thermal stabilities (12% fall-off at 140° C.) comparable with red inorganic phosphors already render QDs commercially viable in lower flux/temperature optical down-conversion applications'. To further avoid damaging QDs by prolonged biasing, one can apply time-varying voltage waveforms to reduce stress on the device by minimizing the average net applied voltage.

Low voltage operation/low power consumption: Previous studies have shown that QD PL QY is quenched under applied electric fields of ~$10^5$ to $10^6$ Vcm$^{-1}$, equivalent to voltages on the order of 1-20V for typical QD film thicknesses of a few tens of nanometers. Voltages required to switch QD PL on and off are therefore comparable with those of traditional LCDs, implying low power operation.

Increased brightness: In an OLED or traditional QD-LED display, to increase the brightness of a pixel it is necessary to increase the current through that pixel and the voltage applied across the pixel. As noted above, the EQE of a pixel falls as the applied bias increases, and high current densities can contribute to Auger-induced quenching. These effects lead to diminishing returns in brightness under increasing bias. Even in the absence of these effects, the maximum achievable brightness of electrically-driven LEDs is limited because electrically-biased devices can only withstand limited voltages before breakdown occurs. In the PLP devices proposed here, the brightness increases in proportion to the intensity of the excitation light source, and is not limited by electrical breakdown of the device. Photoluminescence also does not suffer from the same saturation effects at high brightness as electroluminescence, so higher brightness should be achievable using the PLP architecture.

In comparison with phosphor-LCDs, QD emission is brighter and more stable; the proposed device operating mechanisms offer novels ways to modulate emission; and transparent devices are achievable. To perform competitively, phosphor LCDs require phosphors with high PL QYs under UV excitation, which is extremely rare. Indeed, many phosphors are chemically decomposed by high energy UV light. In comparison, QD PL is commercially proven to be extremely stable under continuous UV illumination, with PL QYs typically approaching unity.

Operational Principle

A number of physical phenomena can be used to achieve the desired diminishment of the emitter PL under applied voltage, including but not limited to the stark effect, the exciton dissociation, the hot charge carrier trapping, rotation of emitter particles, rotation of emitter particles, and charge injection. These phenomena may act in isolation or in combination to diminish the emitter PL.

Regarding the Stark effect, an applied electric field partially polarizes excitons in the emitter, decreasing the spatial overlap of the electron and hole wavefunctions. See, for example, Empedocles, S. A. et al., Science, 278, 2114-2117 (1997), which is incorporated by reference in its entirety. By Fermi's Golden Rule, the rate of radiative recombination (i.e. photoluminescence) of the exciton is proportional to the electron-hole overlap; thus, an applied electric field will diminish the PL intensity (a phenomenon known as the Stark effect, or, in the case of nanostructured emitters, the quantum confined Stark effect). The electron and hole can be uniformly separated or, in the case of a multi-layer core-shell QD, separated and delocalized to different extents over different materials. In this instantiation, the barrier layers are likely made from insulating dielectric materials, preventing the injection of charge into the emitter, but appropriately chosen semiconductors can also be used.

Under a strong enough electric field, the forces on the electron and hole comprising an exciton can be sufficiently strong to completely dissociate the exciton and thus, in the ideal case, completely quench the PL. In this instantiation, as in that described above, the barrier layers can likely be made from insulating dielectric materials, preventing the injection of charge into the emitter, but appropriately chosen semiconductors can also be used.

The application of the electric field can generate the possibility for either normal excitons or "hot" excitons (excitons in their initial high-energy state immediately following excitation by the excitation beam and before thermal relaxation to the band-edge state) to decay by transferring one or both of their constituent electron and hole into a surface or bulk charge trap state or metallic state on or adjacent to an emitter particle. As in the above case, by destroying the excitons or a population thereof, the PL intensity can be diminished. See, for example, Pandey, A. et al., J. Phys. Chem. Lett. 1, 45-47 (2010); Galland, C. et al., Nature 479, 203-207 (2011), each of which is incorporated by reference in its entirety. In this instantiation, as in those described above, the barrier layers can be made from insulating dielectric materials, preventing the injection of charge into the emitter, but appropriately chosen semiconductors can also be used.

Directional emitter particles including (but not limited to) nanorods, nanowires, or nanoplatelets can be allowed to rotate in response to the application of the applied electric field. The direction of emission of the particles can be out of the plane of the substrate without the application of the electric field, and into the plane of the substrate (perpendicular to the viewing direction) with the application of the electric field (with intermediate orientations available for voltages between these two extremes). The rotation of the emitters can also enable greater polarization of the exciton and correspondingly greater quenching in addition to the rotation of the emission angle away from the viewing angle, but this effect is not required. In this instantiation, as in those described above, the barrier layers can be made from insulating dielectric materials, preventing the injection of charge into the emitter, but appropriately chosen semiconductors can also be used.

Charge-transporting semiconductors (or extremely thin layers of insulating dielectrics that allow charge transfer through quantum tunneling) can be used as one or both of the barrier layers instead of the thick insulating dielectrics described above. Such a charge-transporting barrier layer or layers can allow injection of charge into the emitter layer under an applied electric field. The injected charge can then quench the PL through a process such as (but not limited to) Auger recombination. This instantiation can function similarly to the above examples, where the PL recovers as soon as the electric field is removed; or it can utilize a bistable emitter, where voltage of one polarity charges the emitter particles and quenches the emission, and voltage of the opposite polarity discharges the emitter particles and re-enables the emission.

Device Example

FIG. 1 shows a particular instantiation of the transparent photoluminescent pixel (TPLP) invention. A "substrate" made of glass, plastic, or other material transparent to the colors of emission from the TPLP, is coated with thin films, in sequence, of a transparent electrode, a transparent barrier layer, an emitter, another transparent barrier layer, and another transparent electrode. Not shown is another optional transparent substrate on top of the top electrode that encapsulates the entire device and prevents mechanical damage to or degradation of the emitter, barriers, and electrodes.

In this instantiation, the excitation light is provided by a light source (a specific example of which is an ultraviolet-emitting light-emitting diode (LED), though other sources are possible) and is incident from the side of the device, propagating parallel to the substrate surface. The excitation light may be waveguided within the top or bottom substrate, or within the electrode/barrier/emitter stack; in the preferable case, the index of refraction of the substrate(s), electrodes, barrier, and emitter at the wavelength of the excitation light will be similar, enabling the majority of the excitation light to impinge upon and be absorbed by the emitter rather than staying confined to the substrate. Difference among the indexes of refraction of the substrate(s), electrodes, barrier, and emitter at the wavelength of the excitation light can be within 30%; difference among the indexes can be within 20%; difference among the indexes can be within 10%; difference among the indexes can be within 5%.

In the "ON" state, no voltage is applied between the two electrodes. The emitter is excited by the excitation light, forming excitons. These excitons radiatively recombine and emit light of lower energy (longer wavelength) than the excitation source. Light exiting the front or back face of the device, perpendicular to the plane of the substrate, is visible to the user (or, in the case of infrared emission, to an infrared camera).

In the "OFF" state, a static or time-varying voltage is applied between the top and bottom electrodes. By any of a number of methods, described herein, this applied voltage results in the complete or partial quenching of the photoluminescence of the emitter. It is preferable that different intensities of emitter photoluminescence between the "ON" and "OFF" states may be accessed in a continuous manner by continuously varying the voltage between zero and the voltage required for complete quenching.

Figure 2:
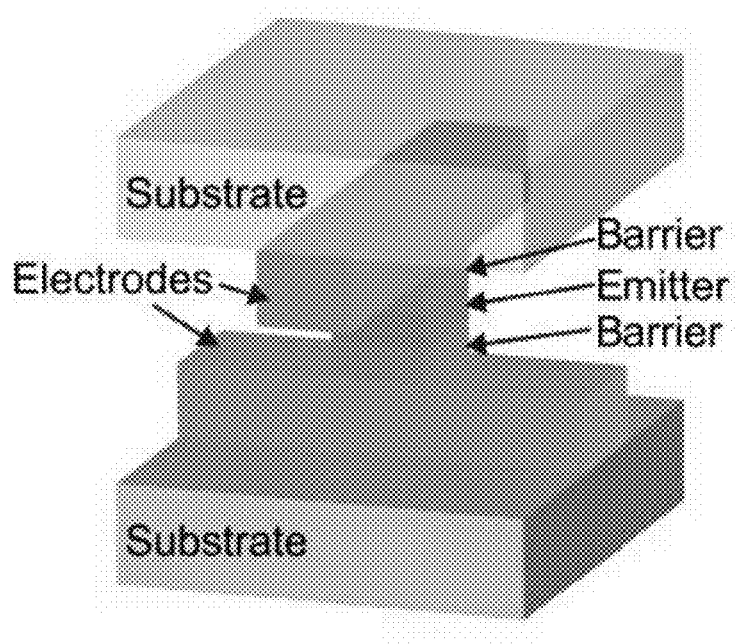
FIG. 2 shows a three-dimensional schematic view of a single PLP with crossed top and bottom electrodes.
Figure 3:
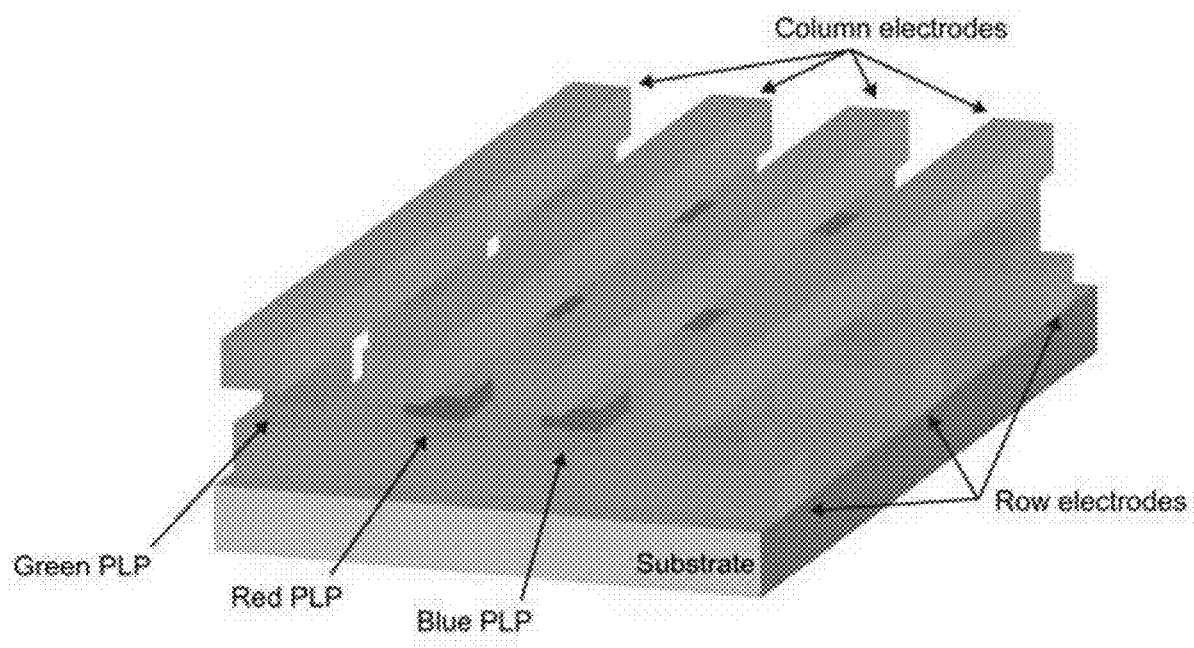
FIG. 3 shows an array of red, green, and blue PLPs as a fraction of a photoluminescent display.

FIG. 2 shows a three-dimensional schematic view of a single PLP with crossed top and bottom electrodes. The optional top substrate is shown here. FIG. 3 shows an array of red, green, and blue PLPs as a fraction of a photoluminescent display. In another embodiment, it can use a backplane including or consisting of an array of thin-film transistors, instead of crossed top and bottom electrodes, to individually address each PLP.

Heterostructures may be used for the photoluminescent pixel. A heterostructure can include semiconductor materials with different band gaps; a heterostructure can include both semiconductor and metal. In one type of heterostructure, the optically excited carriers can be confined in the lower band gap material, whereas in another type of heterostructure, the electrons can be localized in one material, and the holes in the other material.

Asymmetric nanosized structures made of various materials, such as a nanorod made of sections of different materials, can be used for the photoluminescent pixel. Aligned nanorods may enable greater decrease in electron-hole overlap under applied electric field. In one example, a nanorod that includes sections of CdSe, CdS, and metal can be used for the device. In this example, the exciton will reside on the CdSe in the absence of an electric field; under the application of an appropriate electric field along the axis of the nanorod pointing away from the metal (thus drawing the negatively charged electron toward the metal), the exciton can extend into the metal and can rapidly recombine, quenching the emission. In another example, a nanorod can include sections of CdSe and CdS. The conduction bands of CdSe and CdS are of similar energy, while the valence band of CdS is much deeper in energy than that of CdSe. Under an applied electric field along the axis of the nanorod pointing away from the CdS, the electron of the exciton could be pulled into the CdS, while the hole remains on the CdSe; this spatial separation of the electron and hole can result in a significant quenching of the PL, as desired.

Figure 4:
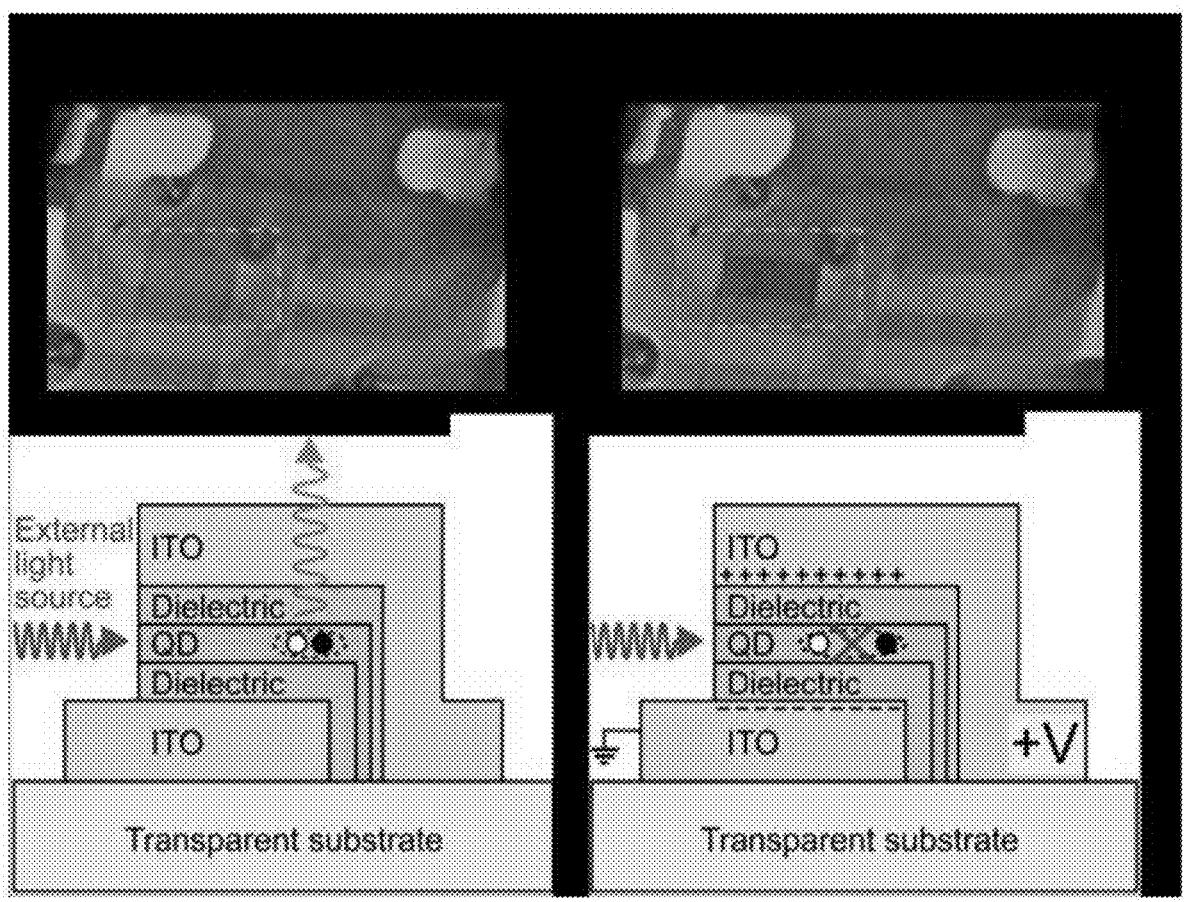
FIG. 4 shows a photograph of the proof-of-concept device under dc bias in "ON" and "OFF" states.
Figure 5:
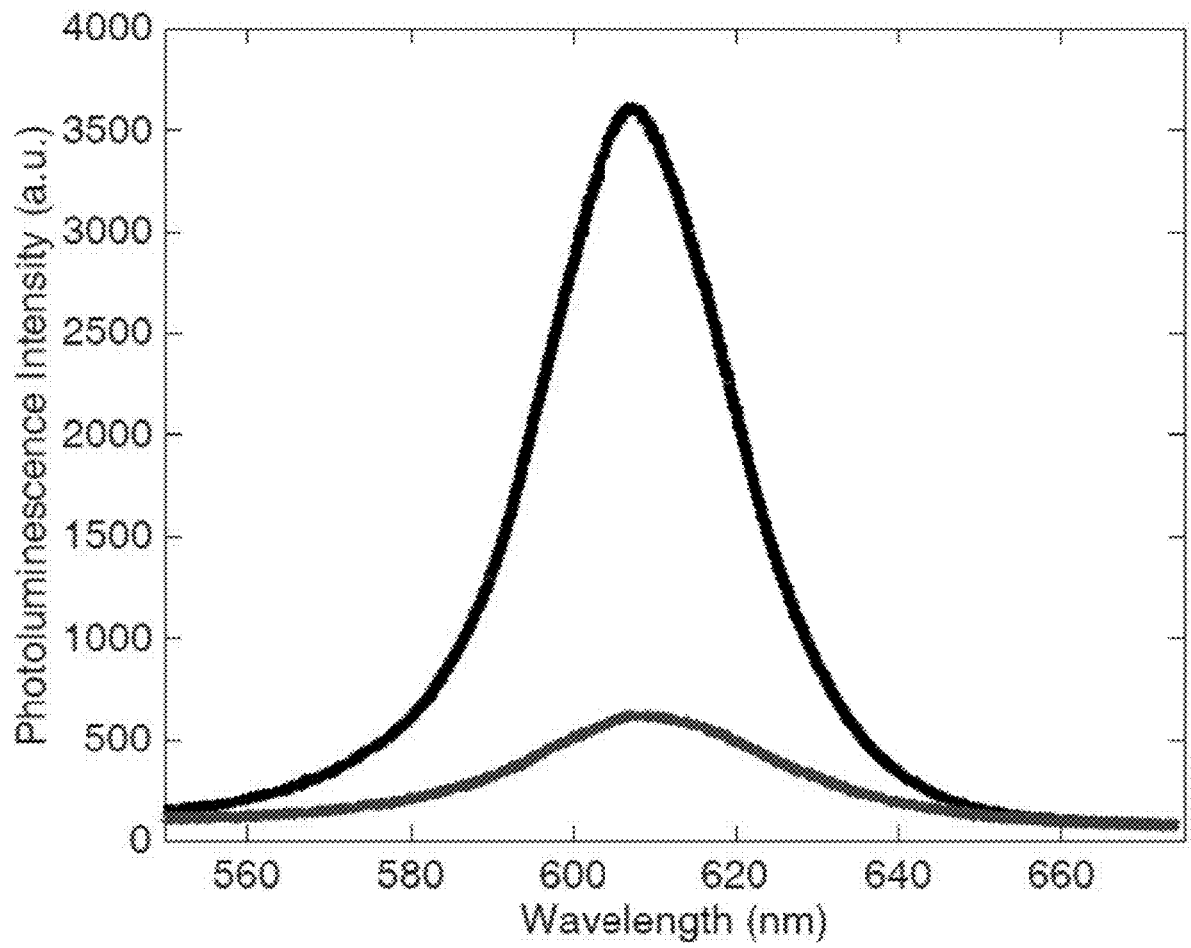
FIG. 5 shows a PL spectrum from the QD film under ultraviolet excitation in absence of applied bias and under 40 V dc bias.

As an initial proof of concept, devices with the following architecture have been fabricated: Glass/Indium Tin Oxide (130 nm)/Hafnium Oxide (45 nm)/QD (~50 nm)/Parylene-C (10 nm)/Hafnium Oxide (45 nm)/Aluminum (100 nm). Indium tin oxide and aluminum serve as electrodes. Hafnium oxide beneath the QD film, and parylene-C and hafnium oxide above the QD film, each serve as insulators enabling the application of electric fields across the QD film in absence of charge injection upon application of voltage. As intended, modulation of PL emission was observed from the ultraviolet light-excited QD film under addition (PL quenched or 'OFF' state) and removal (PL recovered or 'ON' state) of an external electric field. Electric field-induced PL quenching was observed under application of both dc and ac (1 Hz to 1 kHz has been investigated) fields. FIG. 4 is a photograph of the proof-of-concept device under dc bias in both: (left) "ON" (0 V dc) and (right) "OFF" (40 V dc) states. Ultraviolet excitation is from the side and emission is through top and bottom substrates. FIG. 5 is a PL spectrum from the QD film under ultraviolet excitation in absence of applied bias (0 V dc) and under 40 V dc bias, demonstrating a roughly 85% reduction in PL intensity upon application of electric field.

Colloidal Quantum Dots

When the electron and hole localize on a quantum dot, also referred to as a nanocrystal, emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include Group II-VI compounds, Group II-V compounds, Group III-VI compounds, Group III-V compounds, Group IV-VI compounds, Group compounds, Group II-IV-VI compounds, or Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, Pb Se, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis (silyl) chalcogenide, dioxygen, an ammonium salt, or a tris(silyl) pnictide. Suitable X donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group compounds, Group II-IV-VI compounds, and Group II-IV-V compounds, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal outer layers are described in U.S. Pat. No. 6,251,303, which is incorporated by reference in its entirety.

More specifically, the coordinating ligand can have the formula:

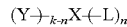

wherein k is 2, 3 or 5, and n is 1, 2, 3, 4 or 5 such that k−n is not less than zero; X is O, S, S=O, $SO_2$, Se, Se=O, N, N=O, P, P=O, As, or As=O; each of Y and L, independently, is aryl, heteroaryl, or a straight or branched $C_{2-12}$ hydrocarbon chain optionally containing at least one double bond, at least one triple bond, or at least one double bond and one triple bond. The hydrocarbon chain can be optionally substituted with one or more $C_{1-4}$ alkyl, $C_{2-4}$ alkenyl, $C_{2-4}$ alkynyl, alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—, —P($R^a$)—, or —P(O)($R^a$)—. Each of $R^a$ and $R^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Other embodiments are within the scope of the following claims.

What is claimed is:
1. A light emitting device comprising:
a light source;
a first electrode;
a second electrode;
a first barrier layer;
a second barrier layer; wherein the first barrier layer and the second barrier layer are between the first electrode and the second electrode, and
an emitter layer between the first barrier layer and the second barrier layer,
wherein the emitter layer includes a photoluminescent pixel capable of being excited by the light source;
wherein at least one of the first barrier layer and the second barrier layer is transparent, and at least one of the first electrode and the second electrode is transparent and wherein indexes of refraction of the first electrode, the second electrode, the first barrier layer, the second barrier layer, and the emitter layer at a wavelength of the light source are similar to enable a majority of an excitation light to impinge upon and be absorbed by the emitter layer rather than staying confined to a substrate, and the emitter layer includes a quantum confined nanostructured material.
2. The light emitting device of claim 1, wherein indexes of refraction of the first electrode, the second electrode, the first barrier layer, the second barrier layer, and the emitter layer at a wavelength of the light source are within 30% of each other.
3. The light emitting device of claim 1, wherein the emitter layer includes a plurality of photoluminescent pixels.

4. The light emitting device of claim 1, wherein the emitter layer includes photoluminescent pixels of different colors.

5. The light emitting device of claim 1, wherein the emitter includes a red photoluminescent pixel, a green photoluminescent pixel, and a blue photoluminescent pixel.

6. The light emitting device of claim 1 further comprising a substrate, wherein the substrate is transparent.

7. The light emitting device of claim 1, wherein both the first electrode and the second electrode are transparent.

8. The light emitting device of claim 1, wherein both the first barrier layer and the second barrier layer are transparent.

9. The light emitting device of claim 1, wherein the first electrode or the second electrode is opaque.

10. The light emitting device of claim 1, wherein the first barrier layer or the second barrier layer is opaque.

11. The light emitting device of claim 1, wherein the emitter layer has a thickness of less than 100 nm.

* * * * *